(12) United States Patent
Wu (10) Patent No.: US 11,483,022 B2
(45) Date of Patent: Oct. 25, 2022

(54) WIDEBAND TUNABLE FREQUENCY SINGLE-SIDEBAND CONVERTER WITH PVT TRACKING

(71) Applicant: Tubis Technology Inc., San Diego, CA (US)

(72) Inventor: Kenny Kun-Long Wu, San Diego, CA (US)

(73) Assignee: Tubis Technology INC., San Diego, CA (US)

( * ) Notice: Subject to any disclaimer, the term of this patent is extended or adjusted under 35 U.S.C. 154(b) by 50 days.

(21) Appl. No.: 17/103,331

(22) Filed: Nov. 24, 2020

(65) Prior Publication Data

US 2021/0159929 A1   May 27, 2021

Related U.S. Application Data (60) Provisional application No. 62/940,716, filed on Nov. 26, 2019.

(51) Int. Cl.
*H04B 1/26* (2006.01)
*H03H 7/21* (2006.01)
(Continued)

(52) U.S. Cl.
CPC ............... *H04B 1/26* (2013.01); *H03H 7/20* (2013.01); *H03H 7/21* (2013.01); *H03H 2007/0192* (2013.01)

(58) Field of Classification Search
CPC ... H04B 1/26; H03H 7/20; H03H 7/21; H03H 2007/0192
See application file for complete search history.

(56) References Cited

U.S. PATENT DOCUMENTS

| 4,021,747 A | * 5/1977 | Todokoro | ............... H03F 3/345 330/264 |
| 7,400,212 B1 | 7/2008 | Vishinsky | .................... 333/17.1 |

(Continued)

FOREIGN PATENT DOCUMENTS

| EP | 2530839 A1 | 1/2010 |
| WO | WO2011149691 A1 | 5/2010 |
| WO | WO2014055796 A1 | 10/2012 |

OTHER PUBLICATIONS

International Search Report and Written Opinion of International Search Authority for PCT/US2020/062110 dated Mar. 15, 2021 (11 pages).

*Primary Examiner* — Dac V Ha
(74) *Attorney, Agent, or Firm* — Imperium Patent Works; Zheng Jin (57) ABSTRACT

A wideband tunable frequency single-subband converter is proposed. The wideband frequency tunable converter operates within a wideband and tunable frequency range, and has process, voltage, and temperature (PVT) tracking capability. In one embodiment, the wideband converter comprises a frequency tunable polyphase filter having a plurality of switchable polyphase resistors. The polyphase resistors are controlled by a frequency tuning control signal to achieve wideband frequency tunability. In a preferred embodiment, a triode mode transistor is used as a polyphase resistor, and a different resistance value of the polyphase filter is realized by turning on one or multiple of the different transistors in triode mode. In addition, a constant Gm(R) bias generator is used to provide the gate biases to the triode mode transistors to maintain a constant and stable resistance value across PVT and other variation.

20 Claims, 8 Drawing Sheets

(51) Int. Cl.
*H03H 7/20* (2006.01)
*H03H 7/01* (2006.01)

(56) References Cited

U.S. PATENT DOCUMENTS

| | | | |
|---|---|---|---|
| 7,613,249 B1* | 11/2009 | Tsai | H04L 25/03828 375/296 |
| 10,305,428 B1* | 5/2019 | Yang | H03D 7/1458 |
| 2004/0125240 A1 | 7/2004 | Stikvoort et al. | 348/731 |
| 2004/0137869 A1 | 7/2004 | Kim | 455/324 |
| 2006/0111074 A1* | 5/2006 | Petilli | H03M 3/496 455/313 |
| 2007/0047669 A1* | 3/2007 | Mak | H04B 1/28 375/316 |
| 2007/0171312 A1* | 7/2007 | Kishi | H03D 3/007 348/726 |
| 2011/0291758 A1 | 12/2011 | Hsieh | 330/253 |
| 2012/0296608 A1 | 11/2012 | Tomitsuka et al. | 702/190 |
| 2013/0342267 A1 | 12/2013 | Jalaleddine | 327/552 |
| 2014/0099893 A1 | 4/2014 | Kheirkhahi et al. | 455/41.2 |

* cited by examiner

POLYPHASE FILTER

FIG. 4

PREFERRED EMBODIMENT OF SWITCHED-R

FIG. 5

PREFERRED EMBODIMENT OF THE SWITCH

FIG. 6

PREFERRED EMBODIMENT OF THE CONSTANT Gm
BIAS GENERATOR

FIG. 10

WIDEBAND TUNABLE FREQUENCY SINGLE-SIDEBAND CONVERTER WITH PVT TRACKING

CROSS REFERENCE TO RELATED APPLICATIONS

This application claims priority under 35 U.S.C. § 119 from U.S. Provisional Application No. 62/940,716, entitled "Wideband Tunable Frequency Single-Sideband Converter with PVT Tracking," filed on Nov. 26, 2019, the subject matter of which is incorporated herein by reference.

TECHNICAL FIELD

The disclosed embodiments relate generally to wireless network communications, and, more particularly, to frequency tunable converter with process, voltage, and temperature (PVT) tracking.

BACKGROUND

Radio Frequency (RF) converters are integrated component assemblies required for converting microwave signals into lower (or intermediate) or higher frequency ranges for further processing. They generally consist of an input filter, a local oscillator filter, an IF filter, a mixer, and frequently an LO frequency multiplier, plus one or more stages of IF amplification. RF frequency converter; may also incorporate a local oscillator, gain compensation (GC) components, and an RF preamplifier. As a system, RF frequency converters function to alter incoming microwave signals into different frequency ranges to allow for a wide range of processing options that could follow. RF frequency converters are available in a number of configurations, defined by the type of frequency they output. Upconverters change microwave signals to a. higher frequency range. Generally an upconverter is designed to produce an output signal frequency for a particular frequency band. By contrast, downconverters alter microwave. signals in to an. intermediate frequency (IF) range, again tuned to a particular frequency band. Some varieties of RF frequency converters are dual upconverters and downconverters, meaning that they can modulate the frequency either up or down, but again, only into a specific range on either side of the spectrum. A final type of converter is the variable converter, which can change the frequency of the input signal to any frequency within the operating range. They are not constrained to produce signals for a particular frequency band, as is the case with upconverters and downconverters.

Wideband tunable frequency converters can operate on wideband, while tuning its operating frequency. RF converters configured using radio frequency integrated circuit (RFIC) are subject to 1) PVT variation (variations in the wafer process, supply voltage, and temperature)—typically results in several dBs of variations if uncompensated; and 2) random variations due to transistor or passive element size variations—this requirement is usually met by limiting the smallest size of transistor, capacitor, resistor to be used within the RFIC. Solutions are sought to achieve wideband frequency tunability, and with PVT tracking to improve the performance of wideband tunable frequency converters.

SUMMARY

A wideband tunable frequency single-subband converter is proposed. The wideband frequency tunable converter operates within a wideband and tunable frequency range, and has process, voltage, and temperature (PVT) tracking capability. In one embodiment, the wideband converter comprises a frequency tunable polyphase filter having a plurality of switchable polyphase resistors. The polyphase resistors are controlled by a frequency tuning control signal to achieve wideband frequency tunability. In a preferred embodiment, a triode mode transistor is used as a polyphase resistor, and a different resistance value of the polyphase filter is realized by turning on one or multiple of the different transistors in triode mode. In addition, a constant Gm(R) bias generator is used to provide the gate biases to the triode mode transistors to maintain a constant and stable resistance value across PVT and other variation.

In one embodiment, a wideband frequency tunable converter with PVT tracking receives an input signal (IF) having a frequency of $f_{IF}$ by a wideband frequency tunable polyphase filter. The polyphase filter converts the IF signal to $IF_I$ and $IF_Q$. The converter amplifies $IF_I$ and $IF_Q$ by a pair of wideband frequency tunable amplifiers and thereby generating amplified input signals with or without polarity inversion of $IF_I$ and $IF_Q$. The converter multiplies the amplified input signals with local oscillator (LO) signals by a pair of double sideband mixers, the LO signals having a frequency of $f_{LO}$. The converter outputs an output signal (RF) from an output summer that are coupled to the mixers. The RF signal has an image frequency of $(f_{IF}+f_{LO})$ or $(f_{IF}-f_{LO})$ under up conversion, selectable by the polarity inversion.

In one preferred embodiment, the polyphase filter is a complex domain filter which comprises a single or multiple stages, each stage contains a set of cross connected resistor and capacitor pairs that converts a single-ended or a differential signal into quadrature differential signals at a specific frequency or vice versa. A wideband polyphase filter can be realized with switchable of resistor of different values, controlled by a frequency tuning control signal. To overcome the resistance variations due to PVT, the polyphase resistor comprises a plurality of triode mode transistors having different transistor sizes, and a gate voltage of each triode mode transistor is provided by a constant Gm(R) bias generator. The constant Gm(R) bias generator provides the bias such that the resistance value of each triode mode transistor remains stable over process, voltage, and temperature (PVT) variation.

Other embodiments and advantages are described in the detailed description below. This summary does not purport to define the invention. The invention is defined by the claims.

DETAILED DESCRIPTION

Reference will now be made in detail to some embodiments of the invention, examples of which are illustrated in the accompanying drawings.

Figure 1:
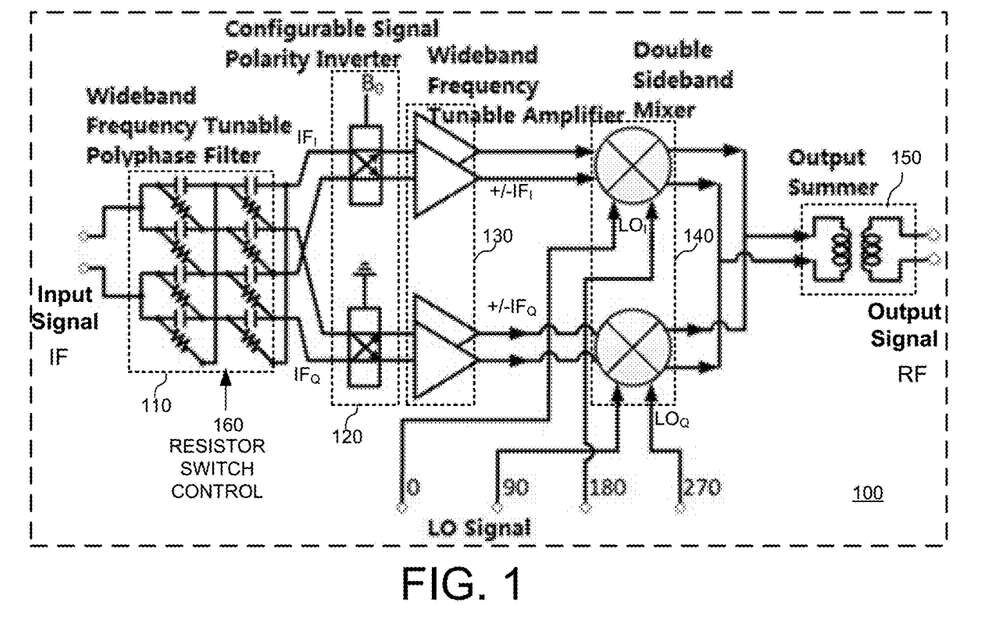
FIG. 1 is a simplified circuit diagram of a wideband tunable frequency single-sideband converter in accordance with one novel aspect.

FIG. 1 is a simplified circuit diagram of a wideband tunable frequency single-sideband converter 100 in accordance with one novel aspect. Wideband tunable frequency single-sideband converter 100 comprises a wideband frequency tunable polyphase filter 110, two configurable signal polarity inverter 120, two wideband frequency tunable amplifier 130, two double sideband mixers 140, and an output summer 150. In the example of FIG. 1, the input signal IF has a frequency of $f_{IF}$ having a wideband frequency range of 50-7000 Hz, the local oscillator signal LO has a frequency of $f_{LO}$. The output signal RF has an image frequency that is either ($f_{IF}+f_{LO}$) or ($f_{IF}-f_{LO}$) for up conversion, depending on whether the polarity inverter 120 is polarity non-inversion (lower sideband mode) or polarity inversion (higher sideband mode).

In accordance with one novel aspect, the wideband frequency tunable converter 100 operates within a wideband and tunable frequency range, and has process, voltage, and temperature (PVT) tracking capability. In one embodiment, the wideband frequency tunable polyphase filter 110 comprises a plurality of switchable polyphase resistors. The polyphase resistors are controlled by a frequency tuning control signal to achieve wideband frequency tunability, e.g., a resistor switch control signal 160 in FIG. 1. In a preferred embodiment, a triode mode transistor is used as a polyphase resistor, and a different resistance value of the polyphase filter is realized by turning on one or multiple of the different transistors in triode mode. In addition, a constant Gm(R) bias generator is used to provide the gate biases to the triode mode transistors to maintain a constant and stable resistance value across PVT variation.

Figure 2:
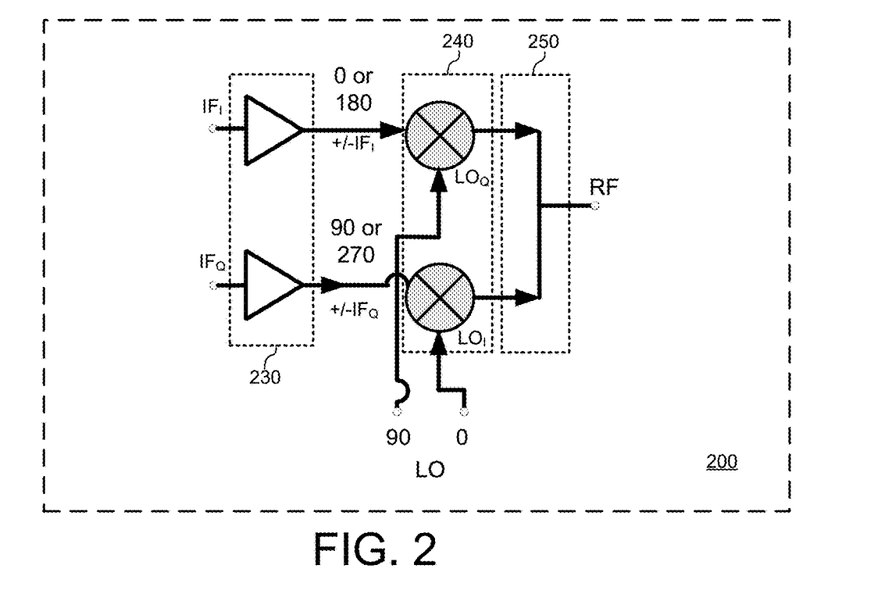
FIG. 2 is a simplified circuit diagram of a single-sideband single-balanced converter that illustrates the operation of a single-sideband mixer.

The operation principle of the single-sideband double-balanced converter can be explained using a simplified single-sideband single-balanced converter. FIG. 2 is a simplified circuit diagram of a single-sideband single-balanced converter 200 that illustrates the operation of a single-sideband mixer. Single-sideband single-balanced converter 200 comprises two frequency tunable amplifiers 230, a single-balanced mixer 240, and a output summer 250. In the example of FIG. 2, the input signal IF has a frequency of $f_{IF}$, the local oscillator signal LO has a frequency of $f_{LO}$. The output signal RF has two image frequencies that is either ($f_{IF}+f_{LO}$) and ($f_{LO}-f_{IF}$) for up conversion, selectable by the signal polarity inversion. For down conversion, the signal enters from opposite direction (marked as RF) in FIG. 2 and the image IF frequency is ($f_{RF}-f_{LO}$) or ($f_{LO}-f_{RF}$), selectable by the signal polarity inversion.

The differential signal input $IF_I$ and $IF_Q$ are quadrature differential signals differ in phase by 90 degree:

$$IF_I=(\cos(2\pi f_{IF}\, t), -\cos(2\pi f_{IF}\, t))$$

$$IF_Q=(\sin(2\pi f_{IF}\, t), -\sin(2\pi f_{IF}\, t))$$

The configurable signal polarity inverter in frequency tunable amplifiers 230 is to invert the signal polarity or leave the signal polarity unchanged of $IF_I$ and $IF_Q$:

$$+/-IF_I=+/-1*(\cos(2\pi f_{IF}\, t), -\cos(2\pi f_{IF}\, t))$$

$$+/-IF_Q=+/-1*(\sin(2\pi f_{IF}\, t), -\sin(2\pi f_{IF}\, t))$$

The LO signals come from a local oscillator and contain quadrature differential signals $LO_I$ and $LO_Q$ that differ in phase by 90 degree:

$$LO_I=(\cos(2\pi f_{LO}\, t), -\cos(2\pi f_{LO}\, t))$$

$$LO_Q=(\sin(2\pi f_{LO}\, t), -\sin(2\pi f_{LO}\, t))$$

To remove one of the image frequency out of the upconverter, both in-phase and quadrature phase components are needed for both input and LO frequencies. The single-balanced mixer 240 and output summer 250 operation can be represented by equation (1) when polarity inverter in 230 is polarity non-inversion (lower sideband mode), and equation (2) when polarity inverter in 230 is polarity inversion (higher sideband mode):

$$RF = \begin{pmatrix} \cos(2\pi f_{IF}t)*\cos(2\pi f_{LO}t) + \sin(2\pi f_{IF}t)*\sin(2\pi f_{LO}t), \\ -\cos(2\pi f_{IF}t)*\cos(2\pi f_{LO}t) - \sin(2\pi f_{IF}t)*\sin(2\pi f_{LO}t) \end{pmatrix} \quad (1)$$

$$= (\cos(2\pi[f_{IF}-f_{LO}]t), -\cos(2\pi[f_{IF}-f_{LO}]t))$$

$$RF = \begin{pmatrix} \cos(2\pi f_{IF}t)*\cos(2\pi f_{LO}t) - \sin(2\pi f_{IF}t)*\sin(2\pi f_{LO}t), \\ -\cos(2\pi f_{IF}t)*\cos(2\pi f_{LO}t) + \sin(2\pi f_{IF}t)*\sin(2\pi f_{LO}t) \end{pmatrix} \quad (2)$$

$$= (\cos(2\pi[f_{IF}+f_{LO}]t), -\cos(2\pi[f_{IF}+f_{LO}]t))$$

Figure 3:
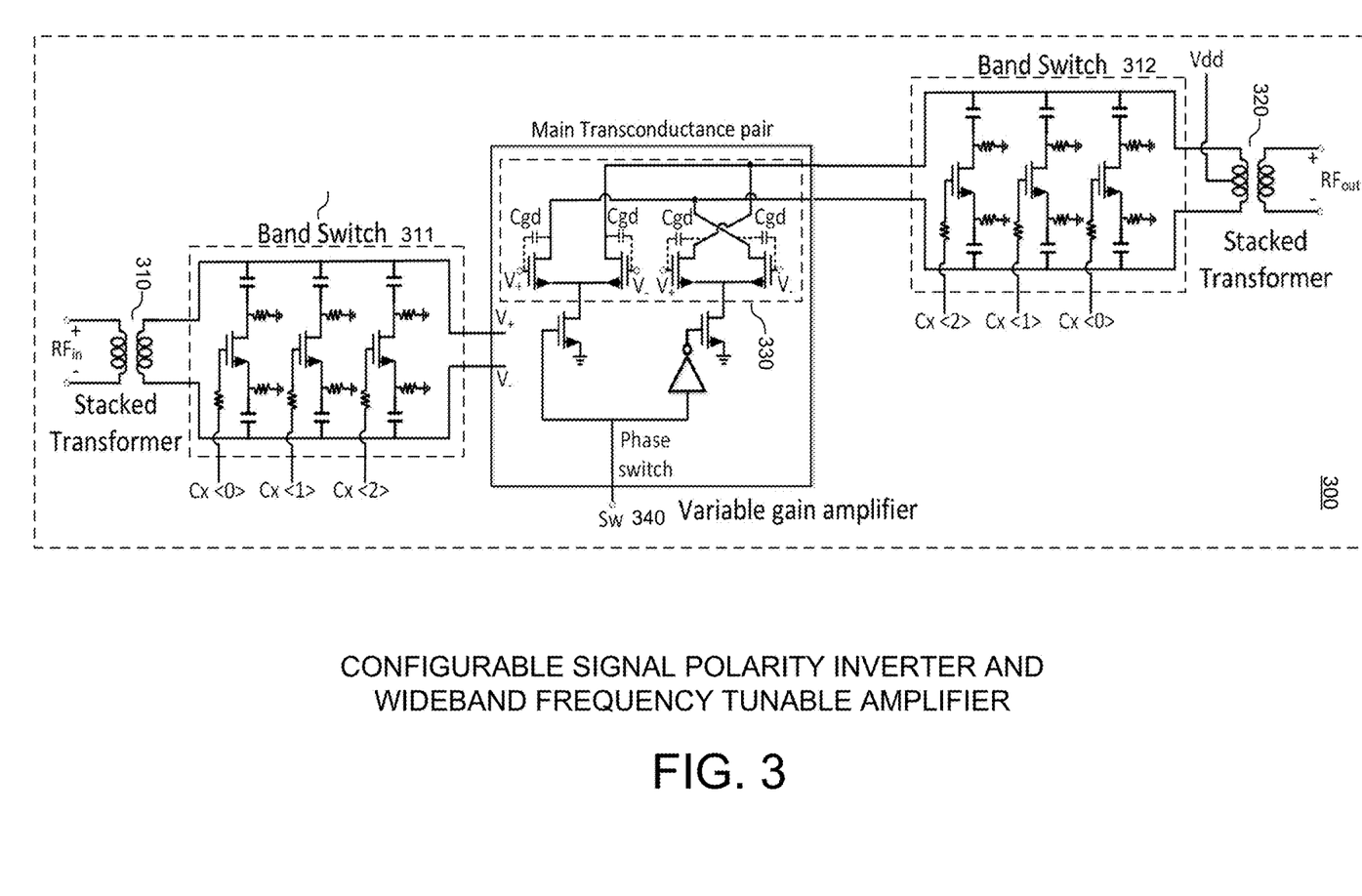
FIG. 3 illustrates one embodiment of a configurable signal polarity inverter and wideband frequency tunable amplifier.

FIG. 3 illustrates one embodiment of a configurable signal polarity inverter and wideband frequency tunable amplifier 300. The amplifier 300 is an exemplary embodiment of the configurable signal polarity inverter 120 and the wideband frequency tunable amplifier 130 as depicted in FIG. 1, which can be used in the wideband tunable frequency single-sideband converter 100 as illustrated in FIG. 1. In the embodiment of FIG. 3, the input radio frequency signal RFin is coupled to an input transformer 310, and the output radio frequency signal RFout is coupled to an output transformer 320. Stacked transformers 310 and 320 are controller by band switches 311 and 312 (switched C), respectively, to achieve the frequency tunability of amplifier 300. Different values of the switched C and the transform resonates achieving a match condition at input and output at different frequencies. Amplifier 300 comprises a main transconductance pair 330, which is formed by two complementary differential transistor pairs. To achieve phase inverter of the amplifier, a phase switch 340 is used to select which of the complementary differential pairs is turned on or turned off. As a result, the polarity of the input signal RFin can be inverted or remain the same. Furthermore, self-neutralization of the drain-to-gate capacitance, e.g., Cgd, in transistors provides excellent reverse isolation and stability. Without neutralization of the parasitic capacitance Cgd, the RF signal would leak to the output from the input or leak to the input from the output. With Self-neutralization, it eliminates the drain-to-gate capacitance via negative feedbacks, i.e., controlled amount of cross-connection to the opposite input signal polarity.

Figure 4:
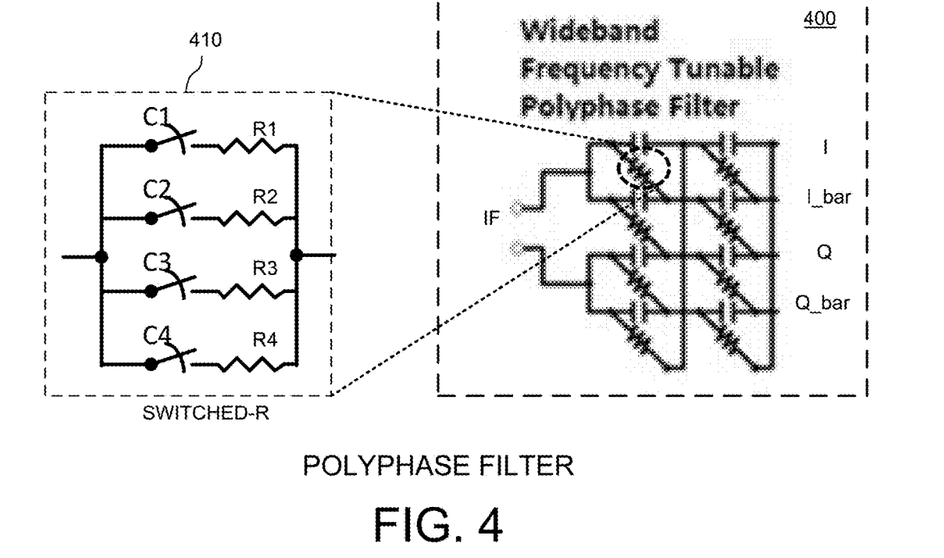
FIG. 4 illustrates a simplified circuit diagram of a wideband frequency tunable polyphase filter in accordance with one novel aspect.

FIG. 4 illustrates a simplified circuit diagram of a wideband frequency tunable polyphase filter 400 in accordance with one novel aspect. Polyphase filter 400 is an exemplary embodiment of the wideband frequency tunable polyphase filter 110 as depicted in FIG. 1, which can be used in the wideband tunable frequency single-sideband converter 100 as illustrated in FIG. 1. In the embodiment of FIG. 4, polyphase filter 400 generates four quadrant (polyphase) signals, e.g., (I, Q, I_bar, Q_bar), or four signals with (0°, 90°, 180°, 270°) phase and equal magnitude. Note that the I and Q signals are (0°, 90°), and the other two signals I_bar and Q_bar are (180°, 270°). The four output signals (0°, 90°, 180°, 270°) are quadrature signals.

The polyphase filter 400 comprises a plurality of R-C networks, consisting of a plurality of polyphase resistors and capacitors that can produce polyphase signals. The R and C time constant determines the operating frequency. To achieve wideband frequency tunability, each polyphase resistor is switchable, as controlled by a frequency tuning control signal. Each polyphase resistor is referred to as a switched-R, as depicted by 410 conceptually. The switched-R 410 comprises four parallel resistors R1, R2, R3, and R4, each controlled by a switch C1, C2, C3, and C4, respectively. By controlling the different switches, different resistor values of polyphase filter 400 can be realized. In one example, a four-bit frequency tuning control signal, each bit controlling one of the four switches, can control up to $2^4=16$ possibilities of the corresponding resistance value of the polyphase resistor 410.

Figure 5:
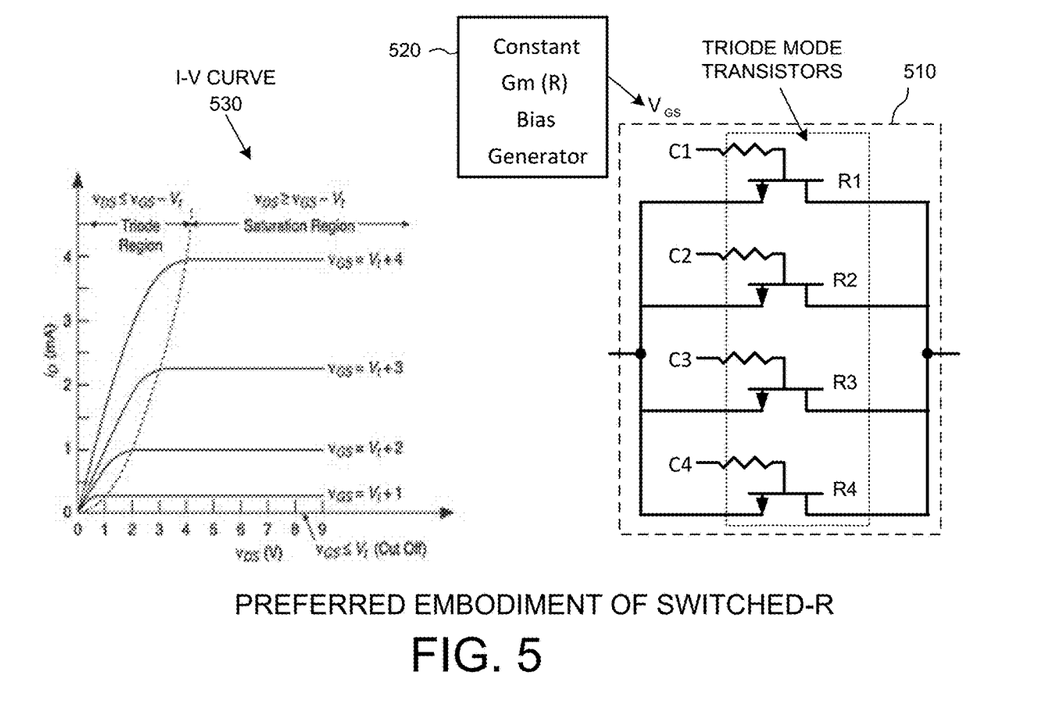
FIG. 5 illustrates a preferred embodiment of a switched-R inside a polyphase filter.

FIG. 5 illustrates a preferred embodiment of a polyphase resistor (switched-R) 510 inside a polyphase filter. In the embodiment of FIG. 5, switched-R 510 comprises four triode mode MOSFET transistors, supplied by a constant Gm(R) bias generator 520. A MOSFET is said to operate in three regions, cutoff, triode and saturation, based on the condition of the inversion layer existed between the source and drain, as depicted in I-V curve 530. The triode region is the operating region where the inversion region exists and current flows, but this region has begun to taper near the source. The potential requirement here is Vds<Vgs−Vth. Here, the drain source current has a parabolic relationship with the drain source potential. The MOSFET can simultaneously operate as a switch, in the "off" mode when it is turned off and in the "on" mode when it is at the triode region. The linear region of a MOSFET can be considered as a special portion of the triode region, where because of the very small value of the applied drain-source potential, there is a roughly linear relationship between Vds and Ids and the MOSFET behaves like a voltage dependent resistor. The potential condition for the linear region or the "deep triode" region is Vds<<Vgs−Vth.

As depicted in FIG. 5, different resistor value R of the switched-R 510 is realized by turning on one or more of the different transistors in triode mode, each transistor with a different Gm value (depending on the corresponding transistor size). That is, $R_1=(1/Gm1)$, $R_2=(1/Gm2)$, $R_3=(1/Gm3)$, and $R_4=(1/Gm4)$. For example, if C1 and C2 are on, then $R=R_1\|R_2$, if C2 and C3 are on, then $R=R_2\|R_3$. In order to maintain each R (or Gm) value across process, voltage, and temperature (PVT) variations, a constant Gm(R) bias voltage generator 520 is used to provide the gate biases $V_{GS}$(C1, C2, C3, C4) to the triode mode transistors.

Figure 6:
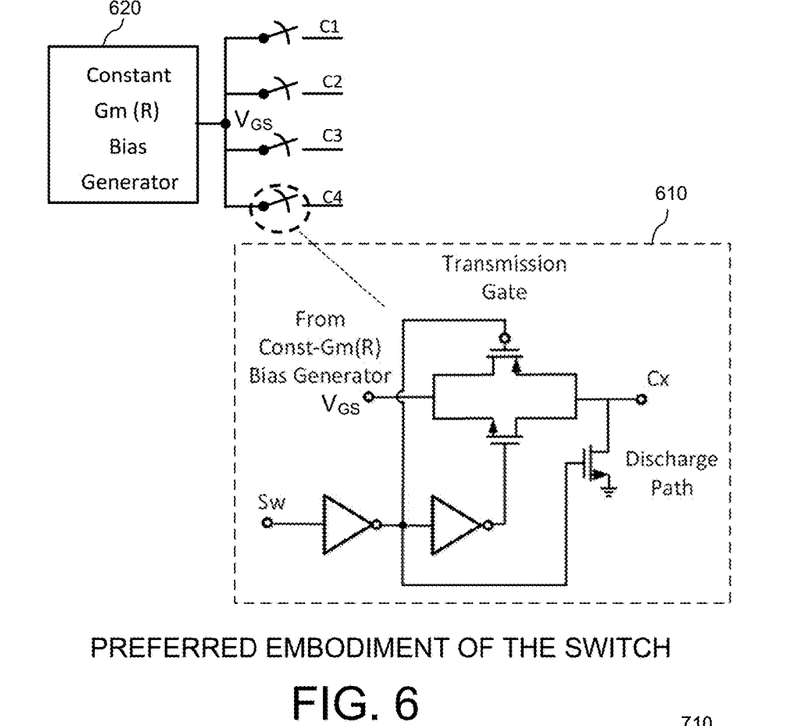
FIG. 6 illustrates a preferred embodiment of a switch for controlling polyphase resistors inside a polyphase filter.

FIG. 6 illustrates a preferred embodiment of a switch 610 for controlling polyphase resistors inside a polyphase filter.

As illustrated earlier in FIG. 4, a polyphase resistor (e.g., 410) is a switched-R, which comprises four parallel resistors R1, R2, R3, and R4, each resistor is controlled by a switch C1, C2, C3, and C4, respectively. In the embodiment of FIG. 6, switch 610 (C4) is controlled by a constant Gm(R) bias generator 620, which generate a constant bias voltage $V_{GS}$. The MOSFET can simultaneously operate as a switch, it is in the "off" mode when it is turned off and in the "on" mode when it is in triode region.

Figure 7:
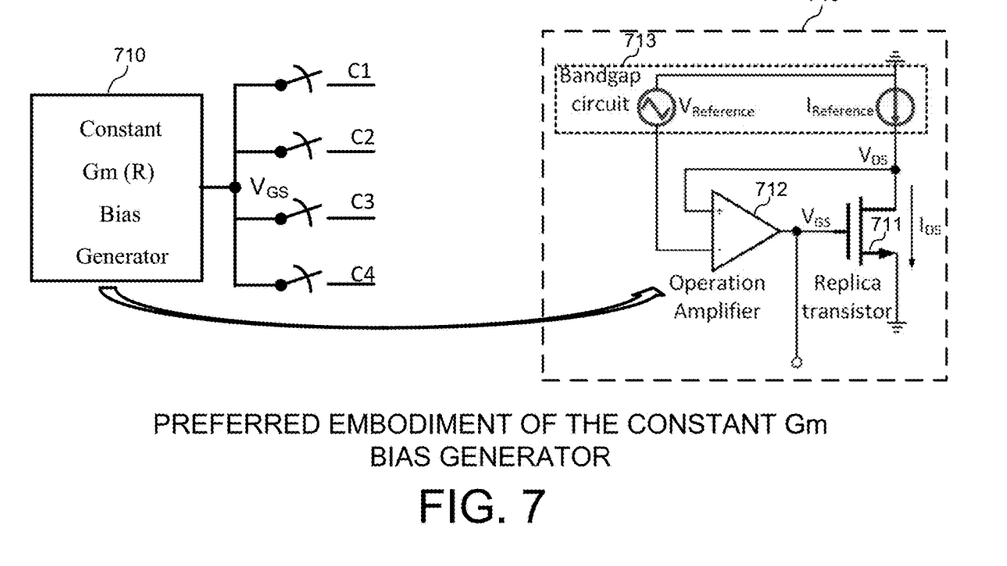
FIG. 7 illustrates a preferred embodiment of a constant Gm(R) bias generator for providing constant bias voltage to switches that control polyphase resistors inside a polyphase filter.

In a typical semiconductor process, the resistor value varies significantly with process and temperature variations. FIG. 7 illustrates a preferred embodiment of a constant Gm(R) bias generator 710 for providing constant bias voltage $V_{GS}$ to switches that control polyphase resistors inside a polyphase filter. The structure of the constant Gm(R) bias generator circuit 710 has three parts: the replica transistor 711, the operation amplifier (OPA) 712, and the bandgap circuit 713. The replica transistor size could be the same or scaled with the transistor size of the switched-R. The current reference $I_{Reference}$ of the bandgap circuit 713 defines the drain to source current $I_{DS}$ of the replica transistor 711. The negative feedback connected OPA 712 forces the drain voltage $V_{DS}$ of the replica transistor 711 to be equal to the voltage reference $V_{Reference}$ of the bandgap circuit 713 by lifting or lowering the gate voltage $V_{GS}$ of the replica transistor 711. The equilibrium biasing of the replica transistor 711 will be $V_{DS}=V_{reference}$ and $I_{DS}=I_{Reference}$. Since the ratio of voltage and the current from the same bandgap circuit 713 are all very stable over process, voltage, and temperature (PVT) variation, the channel resistance ($V_{DS}/I_{DS}$) of the replica transistor 711 is a constant. The $V_{GS}$ is then applying to other switched-R transistors in a polyphase filter that would make them also be a constant channel resistance over process, voltage, and temperature (PVT) and other corner variation. To design the value of the channel resistance in a polyphase filter, a transistor size that is n times over the replica transistor size can be chosen. For example, the channel resistance of the chosen transistor is $(V_{DS}/I_{DS})/n$. If n=2, then the channel resistance in polyphase filter is $(V_{DS}/I_{DS})/2$.

Figure 8:
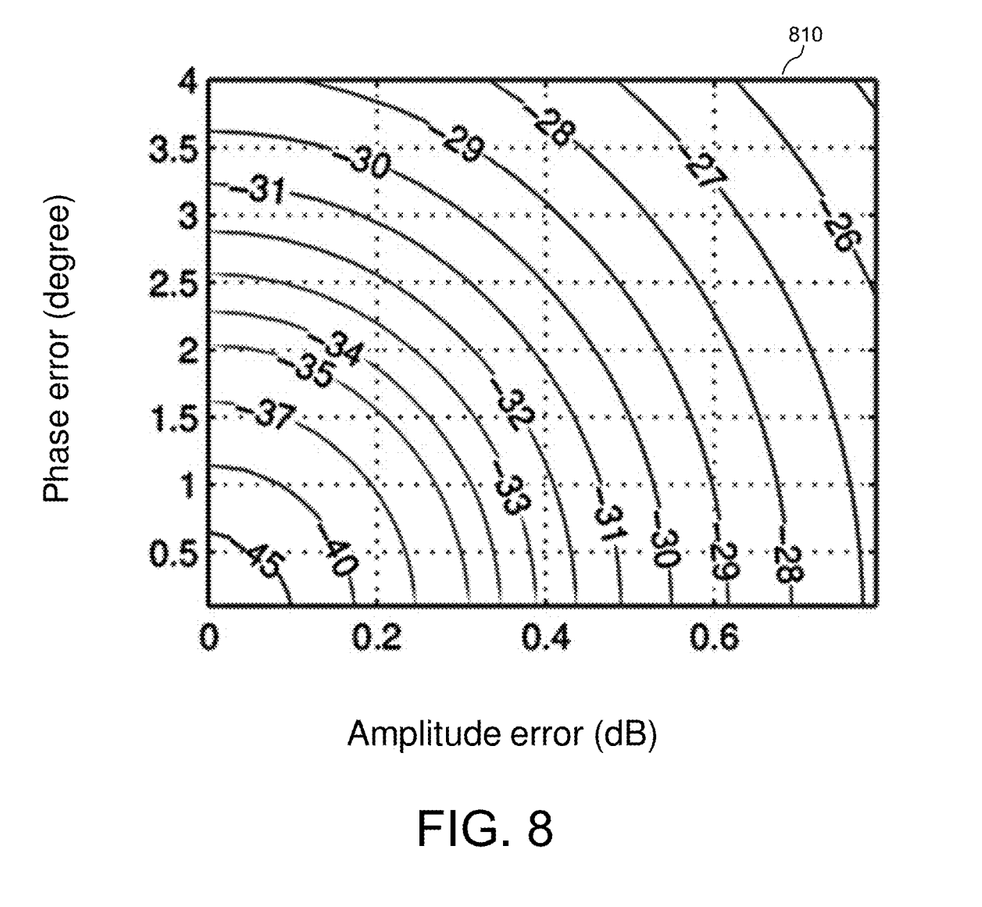
FIG. 8 illustrates the image level over phase or amplitude error in a single-sideband mixer conversion.

FIG. 8 illustrates the image level over phase or amplitude error in a single-sideband mixer conversion, as depicted by 810. The phase error and amplitude error would cause the system impairment that the image would occur in single-side-band mixer conversion. The image level depends on how good is the phase error and amplitude error is, as shown in FIG. 8. The polyphase filter will have perfect phase error and amplitude error at corner frequency Fc. To achieve frequency tunable polyphase filter, the corner frequency Fc, either R or C in the polyphase filter is adjusted. In a preferred embodiment, as illustrated earlier, the R is adjusted via triode transistor. The R is regulated by a constant Gm(R) bias generator.

Figure 9A:
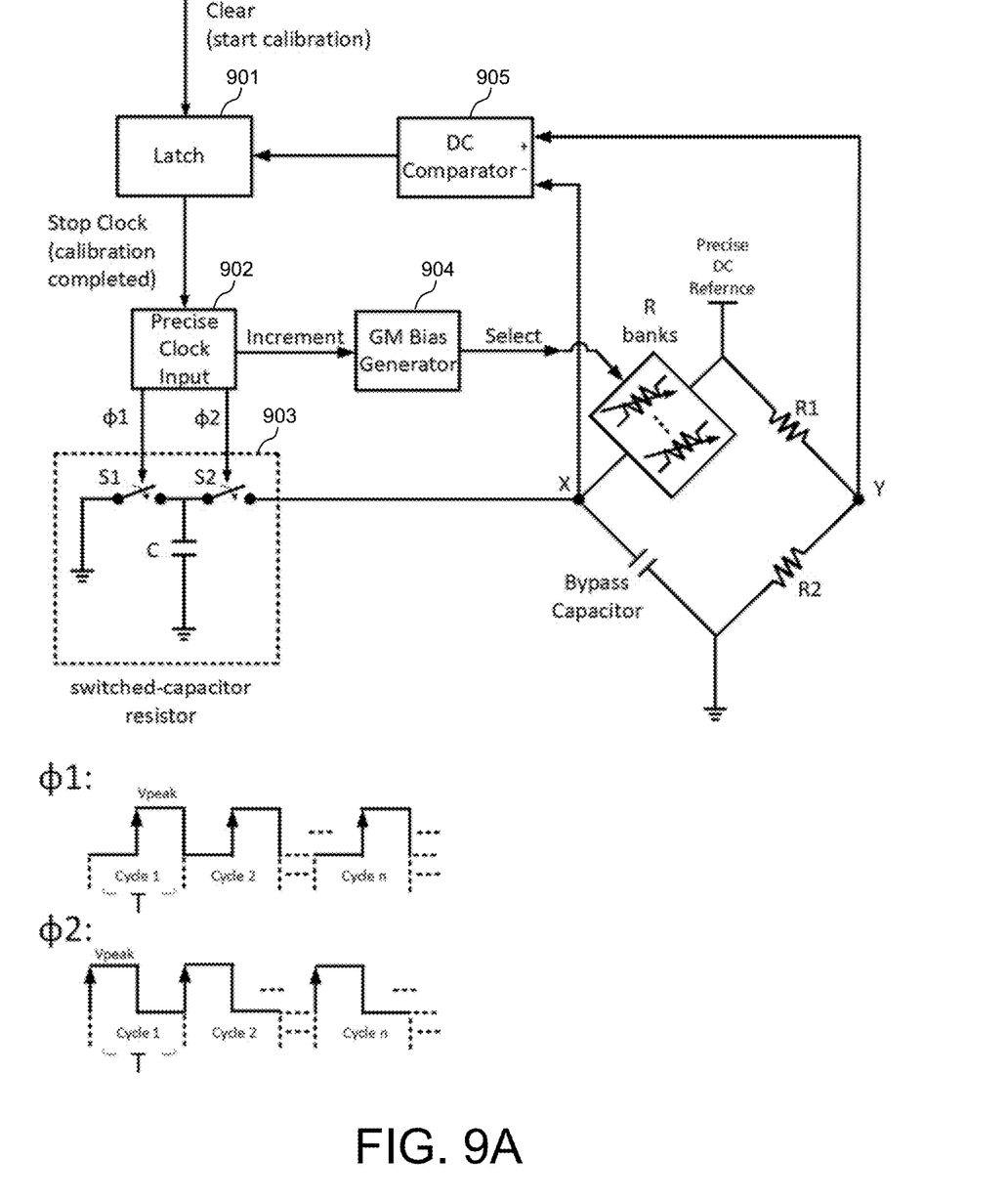
FIG. 9A illustrates RC time constant calibration used for polyphase filter.

FIG. 9A illustrates RC time constant calibration used for polyphase filter. For R-C circuits, the R is regulated by const-Gm(R) bias generate over process, voltage and temperature (PVT) variation. However, despite the capacitor C is insensitive to temperature, the capacitor C still has process variation. The RC time constant calibration is to calibrate the Fc of polyphase filter over the process variation and only have to do it one time after the chip is made. In FIG. 9A, the precise clock 902 generates two period T, amplitude Vpeak, but opposite phase square waves to feed in the switched-capacitor resistor. The equivalent resistance of switched-capacitor resistor 903 is T/C. The R banks, switched-capacitor resistor is voltage divider for precise DC reference.

R1, R2 is another voltage divider for precise DC reference. The bypass capacitor is to attenuate the clock feedthrough at node X.

The level of precise DC reference should make sure the triode transistor is always valid in the switch-R bank. In other words, Vref–$V_x$<Vov (overdrive voltage of the transistor). The value R and C can be scaled up or down comparing to the value R and C of the polyphase filter. The period T/2 should be several RC time constant and it depends on how accuracy the calibration is needed. For example if T/2 large than 3 RC time constant, then the error can be smaller than 5%.

$$\text{Error}(\%) = 100 \times (1 - e^{-T/2RC})$$

The calibration algorithm is as follows. The goal is to search the closest RC/T value to R1/R2 value. The R can be searched from smallest to largest on each certain several cycle of the precise clock, or either way. Once the DC comparator 905 flip its output sign from low to high, the precise clock will stop and the calibration is completed. The polarity of DC comparator, in other words, $V_X$-$V_Y$ or $V_Y$-$V_X$, depends on the direction of searching R in R banks. For example, if the R is searched from smallest to largest, the polarity of DC comparator will be $V_X$-$V_Y$, vice versa.

$$\text{Search } \left[\frac{R_i C}{T}\right]_{i=0 \text{ to } n, \text{ or } i=n \text{ to } 0} \text{ closest to } \frac{R_1}{R_2},$$

Where n is the array number in R banks.

Figure 9B:
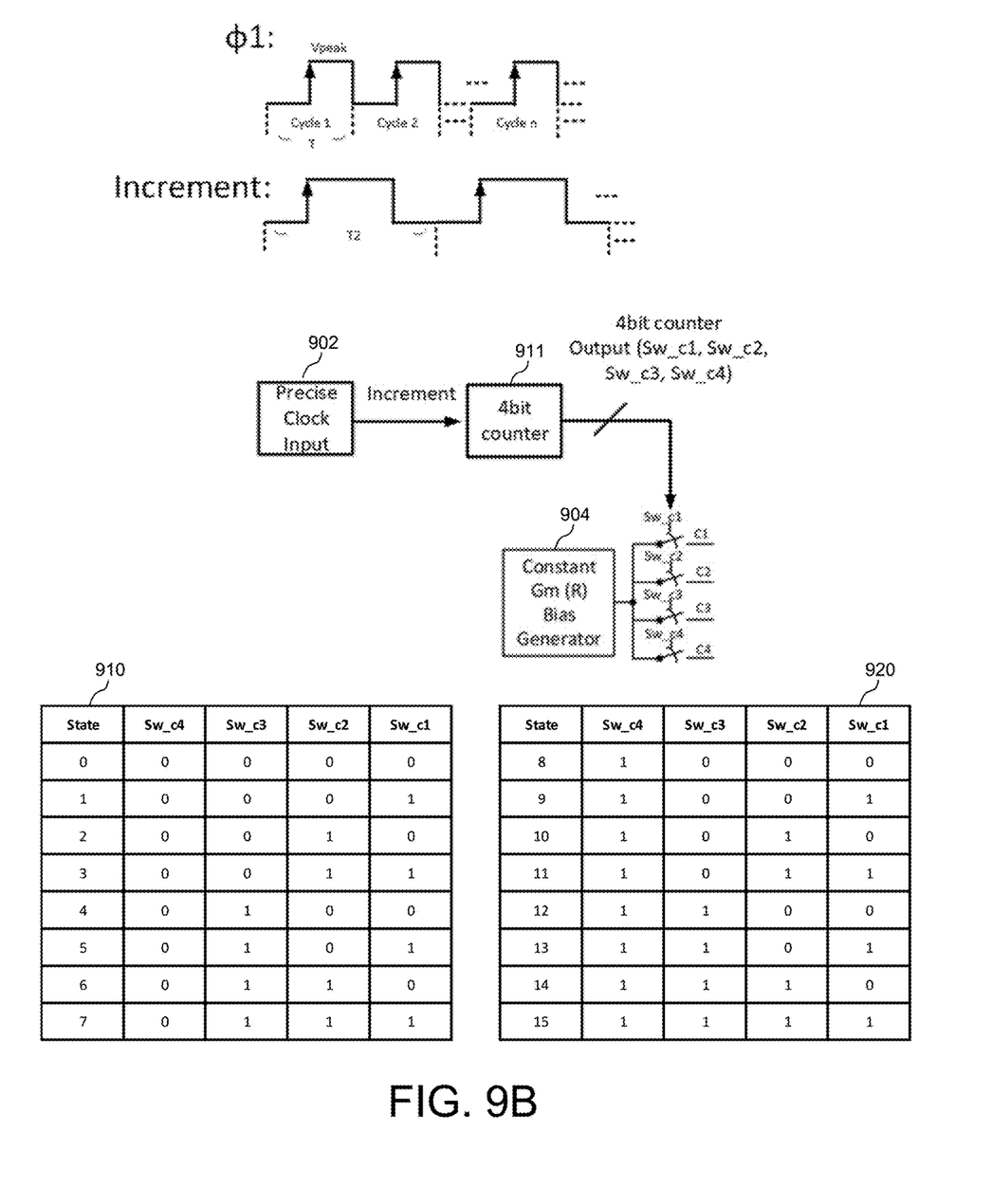
FIG. 9B illustrates one embodiment of RC time constant calibration procedure on state increment of switch-R bank.

FIG. 9B illustrates one embodiment of RC time constant calibration procedure on state increment of switch-R bank. In the example of FIG. 9B, a 4-bit state increment embodiment is shown by 910 and 920. The precise clock 902 will generate a T2 period clock and will be large than T. The longer the T2 period is, the slower the DC comparator can be used. The slower DC comparator means the more accuracy can be achieved. The 4-bit counter 911 will change to the next state when each falling-edge arrive at the counter. If R banks has n-bits triode transistor, then the counter will be n-bits.

Figure 10:
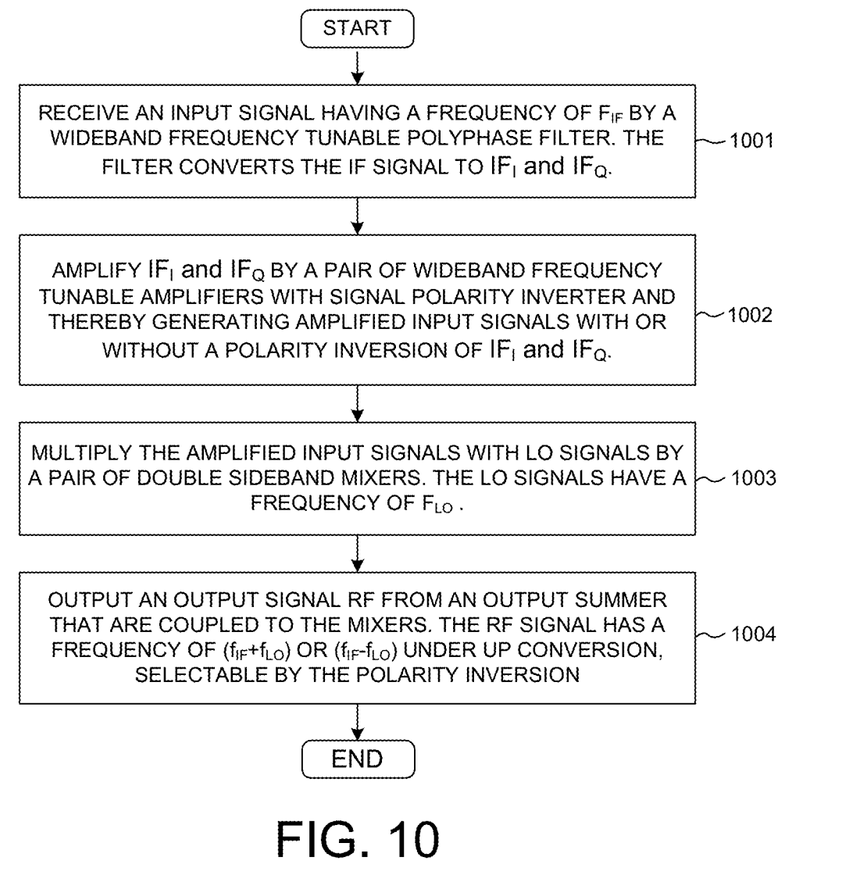
FIG. 10 is a flow chart of a method of converting wideband radio frequency signals with tunable frequency and PVT tracking by a wideband converter in accordance with one novel aspect.

FIG. 10 is a flow chart of a method of converting wideband radio frequency signals with tunable frequency and PVT tracking by a wideband converter in accordance with one novel aspect. In step 1001, the converter receives an input signal (IF) having a frequency of $f_{IF}$ by a wideband frequency tunable polyphase filter. The polyphase filter converts the IF signal to $IF_I$ and $IF_Q$. In step 1002, the wideband converter amplifies $IF_I$ and $IF_Q$ by a pair of wideband frequency tunable amplifiers with signal polarity inverter and thereby generating amplified input signals with or without a polarity inversion of $IF_I$ and $IF_Q$. In step 1003, the wideband converter multiplies the amplified input signals with local oscillator (LO) signals by a pair of double sideband mixers, the LO signals having a frequency of $f_{LO}$. In step 1004, the wideband converter outputs an output signal (RF) from an output summer that are coupled to the mixers. The RF signal has an image frequency of ($f_{IF}$+$f_{LO}$) or ($f_{IF}$–$f_{LO}$) under up conversion, selectable by the polarity inversion.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A wideband frequency tunable converter, comprising:
   a wideband frequency tunable polyphase filter that receives an input signal (IF) having a frequency of $f_{IF}$, wherein the polyphase filter converts the IF signal to $IF_I$ and $IF_Q$;
   a pair of wideband frequency tunable amplifiers that receive $IF_I$ and $IF_Q$ and generates amplified input signals with or without a polarity inversion of $IF_I$ and $IF_Q$;
   a pair of double sideband mixers that multiply the amplified input signals with local oscillator (LO) signals having a frequency of $f_{LO}$; and
   an output summer that are coupled to the mixers and outputs an output signal (RF), wherein the RF signal has an image frequency of either ($f_{IF}$+$f_{LO}$) or ($f_{IF}$–$f_{LO}$) under up conversion, selectable by the polarity inversion, wherein the converter operates under a tunable frequency and with process, voltage, and temperature (PVT) tracking and compensation.

2. The converter of claim 1, wherein the polyphase filter comprises a plurality of polyphase resistors that are controlled by a frequency tuning control signal.

3. The converter of claim 2, wherein each polyphase resistor comprises a plurality of triode mode transistors having different transistor sizes.

4. The converter of claim 3, wherein a gate voltage of each triode mode transistor is provided by a constant Gm(R) bias generator.

5. The converter of claim 4, wherein the constant Gm(R) bias generator comprises a replica transistor having a constant channel resistance value over process, voltage, and temperature (PVT) variation.

6. The converter of claim 5, wherein a resistance value of each triode mode transistor is determined based on a corresponding transistor size and the channel resistance value of the replica transistor.

7. The converter of claim 5, wherein a resistance value of each triode mode transistor remains constant over process, voltage, and temperature (PVT) variation.

8. The converter of claim 1, wherein the amplifier comprises an input transformer and an output transformer with a band switch to achieve frequency tunability.

9. The converter of claim 1, wherein the amplifier comprises a complementary differential transistor pair to achieve phase inversion of $IF_I$ and $IF_Q$.

10. The converter of claim 1, wherein the polyphase filter comprises one or multiple sets of cross connected resistor and capacitor pairs, wherein an RC time constant of each resistor and capacitor pair is calibrated using a precise clock generator.

11. A method for converting a wideband radio frequency (RF) signal with process, voltage, and temperature (PVT) tracking, comprising:
   receiving an input signal (IF) having a frequency of $f_{IF}$ by a wideband frequency tunable polyphase filter, wherein the polyphase filter converts the IF signal to $IF_I$ and $IF_Q$;
   amplifying $IF_I$ and $IF_Q$ by a pair of wideband frequency tunable amplifiers and thereby generating amplified input signals with or without a polarity inversion of $IF_I$ and $IF_Q$;
   multiplying the amplified input signals with local oscillator (LO) signals by a pair of double sideband mixers, the LO signals having a frequency of $f_{LO}$; and outputting an output signal (RF) from an output summer that are coupled to the mixers, wherein the RF signal has a frequency of ($f_{IF}+f_{LO}$) or ($f_{IF}-f_{LO}$) under up conversion, selectable by the polarity inversion, wherein the converter operates under a tunable frequency and with process, voltage, and temperature (PVT) tracking and compensation.

12. The method of claim 11, wherein the polyphase filter comprises a plurality of polyphase resistors that are controlled by a frequency tuning control signal.

13. The method of claim 12, wherein each polyphase resistor comprises a plurality of triode mode transistors having different transistor sizes.

14. The method of claim 13, wherein a gate voltage of each triode mode transistor is provided by a constant Gm(R) bias generator.

15. The method of claim 14, wherein the constant Gm(R) bias generator comprises a replica transistor having a constant channel resistance value over process, voltage, and temperature (PVT) variation.

16. The method of claim 15, wherein a resistance value of each triode mode transistor is determined based on a corresponding transistor size and the channel resistance value of the replica transistor.

17. The method of claim 15, wherein a resistance value of each triode mode transistor remains constant over process, voltage, and temperature (PVT) variation.

18. The method of claim 11, wherein the amplifier comprises an input transformer and an output transformer with a band switch to achieve frequency tunability.

19. The method of claim 11, wherein the amplifier comprises a complementary differential transistor pair to achieve phase inversion of $IF_I$ and $IF_Q$.

20. The method of claim 11, wherein the polyphase filter comprises one or multiple sets of cross connected resistor and capacitor pairs, wherein an RC time constant of each resistor and capacitor pair is calibrated using a precise clock generator.

* * * * *